United States Patent
Reid et al.

(10) Patent No.: US 9,702,592 B2
(45) Date of Patent: Jul. 11, 2017

(54) SYSTEMS AND METHODS FOR SOLAR ENERGY UTILIZATION

(75) Inventors: Lawrence W. Reid, Heber, UT (US); Steven W. Reid, Heber, UT (US)

(73) Assignee: Solar Revolution LLC, Heber, UT (US)

( * ) Notice: Subject to any disclaimer, the term of this patent is extended or adjusted under 35 U.S.C. 154(b) by 2262 days.

(21) Appl. No.: 11/681,252

(22) Filed: Mar. 2, 2007

(65) Prior Publication Data

US 2008/0210293 A1 Sep. 4, 2008

(51) Int. Cl.
*F24J 2/54* (2006.01)
*F24J 2/38* (2014.01)
*H01L 31/048* (2014.01)
*F24J 2/04* (2006.01)

(52) U.S. Cl.
CPC .............. *F24J 2/541* (2013.01); *F24J 2/38* (2013.01); *H01L 31/048* (2013.01); *H01L 31/0488* (2013.01); *F24J 2/045* (2013.01); *F24J 2002/0411* (2013.01); *F24J 2002/5468* (2013.01); *Y02B 10/20* (2013.01); *Y02E 10/47* (2013.01); *Y02E 10/50* (2013.01)

(58) Field of Classification Search
CPC .............. G05B 19/18; F24J 2/38; F24J 2/541
USPC .......... 126/569–570, 604, 618, 400; 136/251
See application file for complete search history.

(56) References Cited

U.S. PATENT DOCUMENTS

| | | | | |
|---|---|---|---|---|
| 2,651,085 A | * | 9/1953 | Kopp | 49/64 |
| 3,292,309 A | * | 12/1966 | Horner | 49/64 |
| 3,960,135 A | * | 6/1976 | Angilletta | 126/628 |
| 3,996,919 A | | 12/1976 | Hepp | |
| 4,002,159 A | * | 1/1977 | Angilletta | E06B 9/264 |
| | | | | 126/600 |
| 4,137,098 A | * | 1/1979 | Field | 136/248 |
| 4,143,640 A | * | 3/1979 | Pierce | 126/600 |

(Continued)

FOREIGN PATENT DOCUMENTS

DE 29901376 U1 * 4/1999 ............. F24J 2/50

*Primary Examiner* — Gregory Huson
*Assistant Examiner* — Nikhil Mashruwala
(74) *Attorney, Agent, or Firm* — Trent Baker; Baker & Associates PLLC

(57) ABSTRACT

The present invention relates to systems and methods for solar energy utilization. One embodiment of the present invention relates to a rotating panel system for solar energy utilization, including thermal, electrical, and visual applications. The system includes a plurality of rotatable panels, a rotation system, and a housing. The housing both mechanically supports the rotatable panels and thermally insulates and/or redirects the heat and/or electricity generated by the panels. A second embodiment of the present invention relates to an automatic climate control system utilizing a rotating panel system. The system includes an enclosed region and a multi-panel solar system. The multi-panel solar system is positioned to extend between the interior and exterior regions of an enclosed region. A third embodiment of the present invention relates to a method for utilizing a plurality of panels to desirably accommodate for visual and thermal forms of solar energy. The method includes positioning a multi-panel solar system in an unobstructed interior to exterior recess and rotating the panels so as to optimally affect the thermal and visual components of the solar energy, depending upon the application.

7 Claims, 5 Drawing Sheets

(56) References Cited

U.S. PATENT DOCUMENTS

| | | | |
|---|---|---|---|
| 4,332,241 A * | 6/1982 | Dalstein et al. | 126/711 |
| 4,389,085 A | 6/1983 | Mori | |
| 4,508,154 A * | 4/1985 | Wheeler | 160/98 |
| 4,538,218 A | 8/1985 | Watson | |
| 4,556,788 A | 12/1985 | Hanak | |
| 4,561,423 A * | 12/1985 | Blasey | 126/604 |
| 4,883,340 A * | 11/1989 | Dominguez | 359/593 |
| 4,956,588 A * | 9/1990 | Ming | 318/16 |
| 5,022,929 A | 6/1991 | Gallois-Montbrun | |
| 5,204,777 A * | 4/1993 | Curshod | 359/596 |
| 5,493,824 A * | 2/1996 | Webster et al. | 52/200 |
| 5,524,381 A * | 6/1996 | Chahroudi | 47/17 |
| 5,531,215 A * | 7/1996 | Schwarz | 126/578 |
| 5,675,487 A * | 10/1997 | Patterson et al. | 700/56 |
| 5,760,558 A * | 6/1998 | Popat | 318/480 |
| 5,818,734 A | 10/1998 | Albright | |
| 6,148,571 A | 11/2000 | Seyller | |
| 6,363,667 B2 | 4/2002 | O'Neill | |
| 6,465,766 B1 | 10/2002 | Zhang | |
| 7,352,509 B2 * | 4/2008 | Pagel | 359/596 |
| 7,677,242 B2 * | 3/2010 | Carcangiu et al. | 126/600 |
| 9,057,535 B2 * | 6/2015 | Frazier | F24J 2/0433 |
| 2004/0100698 A1 | 5/2004 | Aoki et al. | |
| 2005/0243430 A1 | 11/2005 | Cuttle | |
| 2008/0308090 A1 * | 12/2008 | Clive | F24J 2/0433 |
| | | | 126/573 |

\* cited by examiner

SYSTEMS AND METHODS FOR SOLAR ENERGY UTILIZATION

FIELD OF THE INVENTION

The invention generally relates to systems and methods for solar energy utilization. In particular, the present invention relates to a rotating panel system for solar energy utilization, including thermal, electrical, and visual applications and various methods of use.

BACKGROUND OF THE INVENTION

The sun transmits energy to the earth in the form of visual light and thermal radiation. This solar energy has numerous potential uses and effects on human civilization. During particular earth axis orientations, the sun's transmitted visual light reflects off of physical objects, thereby enabling individuals to see, navigate, and differentiate among physical objects. The thermal radiation transmitted by the sun affects the relative temperature at a specific location depending on the earth's axial location with respect to the sun. In an effort to conserve natural resources and optimize energy usage, it is desirable to harness this solar energy for various practical applications. Therefore, these forms of transmitted solar energy are converted via various technologies into other forms of applicable energy, including electrical and hydrothermal. These solar technologies may be categorized as both active solar and passive solar. Active solar technologies incorporate the use of external energy to generate/convert energy from the sun. An example of an active solar system would include a mechanical tracking module coupled to a photovoltaic cell. Whereas, passive solar technology systems utilize the natural thermal transfer properties of the solar energy. Passive solar systems include climate control and water heating systems. Unfortunately, existing active and passive solar technologies fail to provide a system that efficiently utilizes both the visual and thermal properties of solar energy.

A common solar device is a multi-panel solar array designed to affect or harness the transmission of solar energy. Existing multi-panel arrays include conventional window blinds, featuring the ability to rotate the individual panels using a drawstring system so as to change the solar transmission properties. Other multi-panel arrays include photovoltaic solar panels positioned to receive solar energy. Existing multi-panel solar arrays are commonly positioned either on an interior or an exterior surface so as not to affect the climate within a particular space. For example, photovoltaic cells are commonly positioned on an exterior surface of an enclosure because of undesirable thermal affects such as heat transmission. Likewise, window blinds are positioned on interior surfaces adjacent to optically transparent materials such as glass because they are designed to primarily affect the visual light transmission component of solar energy. Unfortunately, window blinds also allow heat to transmit through the adjacent transparent material and into the interior region.

Therefore, there is a need in the industry for a system that efficiently affects both the visual and thermal components of solar energy in a manner that minimizes energy usage.

SUMMARY OF THE INVENTION

The present invention relates to systems and methods for solar energy utilization. One embodiment of the present invention relates to a rotating panel system for solar energy utilization, including thermal, electrical, and visual applications. The system includes a plurality of rotatable panels, a rotation system, and a housing. The housing both mechanically supports the rotatable panels and thermally insulates and/or redirects the heat generated by the panels. A second embodiment of the present invention relates to an automatic climate control system utilizing a rotating panel system. The system includes an enclosed region and a multi-panel solar system. The multi-panel solar system is positioned to extend between the interior and exterior regions of an enclosed region. A third embodiment of the present invention relates to a method for utilizing a plurality of panels to desirably accommodate for visual and thermal forms of solar energy. The method includes positioning a multi-panel solar system in an unobstructed interior to exterior recess and rotating the panels so as to optimally affect the thermal and visual components of the solar energy.

These and other features and advantages of the present invention will be set forth or will become more fully apparent in the description that follows and in the appended claims. The features and advantages may be realized and obtained by means of the instruments and combinations particularly pointed out in the appended claims. Furthermore, the features and advantages of the invention may be learned by the practice of the invention or will be obvious from the description, as set forth hereinafter.

BRIEF DESCRIPTION OF THE DRAWINGS

The following description of the invention can be understood in light of the Figures, which illustrate specific aspects of the invention and are a part of the specification. Together with the following description, the Figures demonstrate and explain the principles of the invention. In the Figures, the physical dimensions may be exaggerated for clarity. The same reference numerals in different drawings represent the same element, and thus their descriptions will be omitted.

DETAILED DESCRIPTION OF THE INVENTION

The present invention relates to systems and methods for solar energy utilization. One embodiment of the present invention relates to a rotating panel system for solar energy utilization, including thermal, electrical, and visual applications. The system includes a plurality of rotatable panels, a rotation system, and a housing. The housing both mechanically supports the rotatable panels and thermally insulates and/or redirects the heat generated by the panels. A second embodiment of the present invention relates to an automatic climate control system utilizing a rotating panel system. The system includes an enclosed region and a multi-panel solar system. The multi-panel solar system is positioned to extend between the interior and exterior regions of an enclosed region. A third embodiment of the present invention relates to a method for utilizing a plurality of panels to desirably accommodate for visual and thermal forms of solar energy. The method includes positioning a multi-panel solar system in an unobstructed interior to exterior recess and rotating the panels so as to optimally affect the thermal and visual components of the solar energy. Also, while embodiments are described in reference to systems and methods for utilizing solar energy, it will be appreciated that the teachings of the present invention are application to other areas.

The following terms are defined as follows:

Panel—any elongated rectangular member including but not limited to a sun-obstructing panel, a photovoltaic panel, a hydrothermal panel, etc.

Climate system—a system that may be used to affect the climate within an enclosed region.

Figure 1:
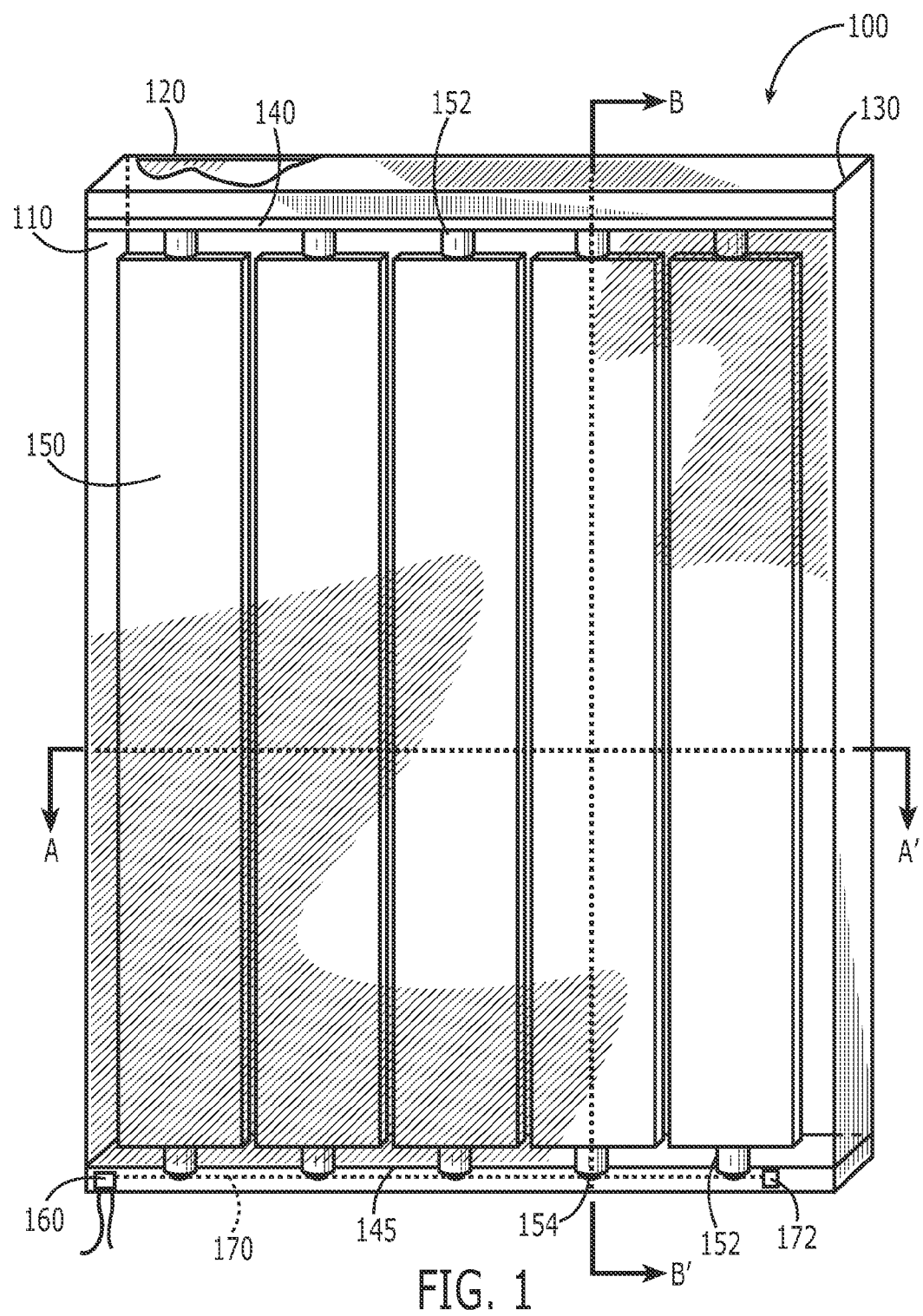
FIG. 1 illustrates a perspective view of a multi-panel system in accordance with one embodiment of the present invention.

Reference is initially made to FIG. 1, which illustrates a perspective view of a multi-panel system in accordance with one embodiment of the present invention, designated generally at 100. The system 100 includes a plurality of panels 150, a housing 130, and a rotation system 160. The plurality of panels 150 are aligned lengthwise and in a manner as to enable lateral rotation. The panels 150 may be any type of panel that affects solar energy, including solar visual obstruction panels, solar insulation panels, solar electrical panels, solar hydrothermal panels, or any combination (hybrid), etc. The spacing of the panels 150 is configured so as to minimize the gaps between the panels 150 when they are rotated into a parallel or flat configuration with respect to the housing. Certain types of panels 150 should be oriented with an active side facing up so as to facilitate solar exposure. The panels 150 are substantially flat but may alternatively be concave or parabolic in order to increase solar exposure. The panels 150 are mechanically and/or electrically coupled to other components of the system 100, as will be described in more detail below.

The housing 130 further includes a frame and a pair of support members 140, 145. The frame supports the system 100 components in a three dimensional configuration that enables the panels 150 to properly rotate without interference. The frame is composed of a rigid supportive material such as metal or wood. Alternatively, the frame may include various coupling brackets to enable the system 100 to be coupled to a beam or structure. The support members 140, 145 rotatably couple the panels to the remainder of the housing 130. In addition, the support members 140, 145 thermally isolate the panels from corresponding rotation chambers. One embodiment of a support member 140 is illustrated and described in more detail with reference to FIG. 4. The housing 130 further includes a front and back transparent member 110, 120. The front and back transparent members 110, 120 are substantially transparent to solar energy but are insulating or reflective to non-solar thermal energy. These members 110, 120 may be composed of any transparent materials, including but not limited to glass, plexiglass, and/or glass composites. The front and back transparent members 110, 120 are mechanically coupled to the housing and oriented so as to be on opposing lengthwise sides of the rotating panels 150, as illustrated. The front and back transparent members 110, 120 are shaped to include more surface area than the sum of the surface areas of all of the plurality of panels 150. The front and back transparent members 110, 120 are also coupled to the frame to enable mounting or positioning the system 100 in various configurations and orientations.

The rotation system 160 is configured to enable the plurality of panels 150 to laterally rotate about a parallel axis of rotation. It should be noted that various types of rotation systems may be utilized in accordance with the present invention. The illustrated rotation system 160 further includes a motor 162, a chain 170, a chain tensioner 172, a plurality of rotable panel couplers 152, and a plurality of chain couplers 154. The illustrated motor 162 is an electric motor which must be coupled to some form of power source (not illustrated) and optionally a control or switching mechanism (not illustrated). The motor 162 is mechanically coupled to the chain 170 such that when the motor is activated, the chain rotates along the illustrated path. The motor 162 and chain 170 may be activated to rotate in either a clockwise or counter-clockwise manner. The chain 170 path is supported in part with a chain tensioner 172 disposed on a side of the system 100 that is opposite from the motor 162. The chain tensioner 172 and motor 162 form the two opposing ends of the chain path. The plurality of panels 150 are rotatably coupled to the housing 130 via panel couplers 152, which extend through the support members 140, 145 as shown. The support members 140, 145 mechanically support the panel couplers 152 while enabling them to rotate. The plurality of panels 150 are coupled to panel couplers 152 on both lengthwise sides. On one side, the panel couplers 152 are further coupled to chain couplers 154 to mechanically couple the plurality of panels to the chain 170. The chain couplers 154 cause the corresponding panel to rotate when the chain 170 rotates, thereby enabling rotational control of the panels via the electrical motor 162.

In operation, the system 100 may be utilized to affect solar energy transmission. Initially, the motor 162 is electrically powered to rotate the chain 170 in a particular rotational direction. The chain 170 interfaces with the chain couplers 154, causing the plurality of panels to rotate. As solar energy is transmitted through either the front or back transparent member 110, 120, it contacts the plurality of panels 150. The plurality of panels 150 obstructs all or a portion of the visual and/or thermal solar energy depending on the orientation of the panels 150, the overall system 100, and the sun (not illustrated). Various electrical control configurations, panel types, and incident sun orientations will be discussed in more detail below.

Figure 2A:
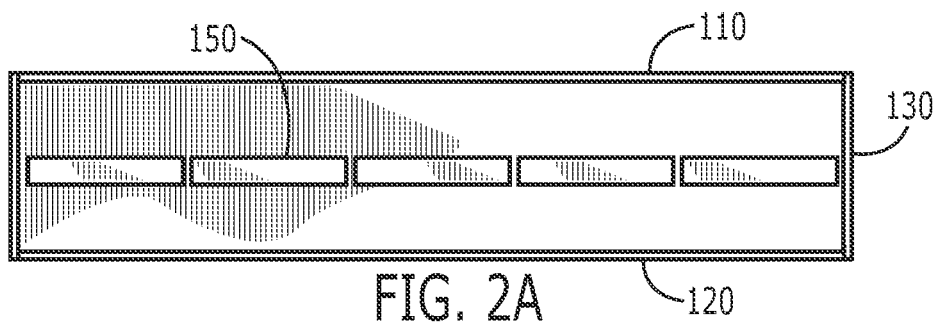
FIGS. 2A-2C illustrate cross-sectional views of the multi-panel system illustrated in FIG. 1 along the lines A-A'.
Figure 2B:
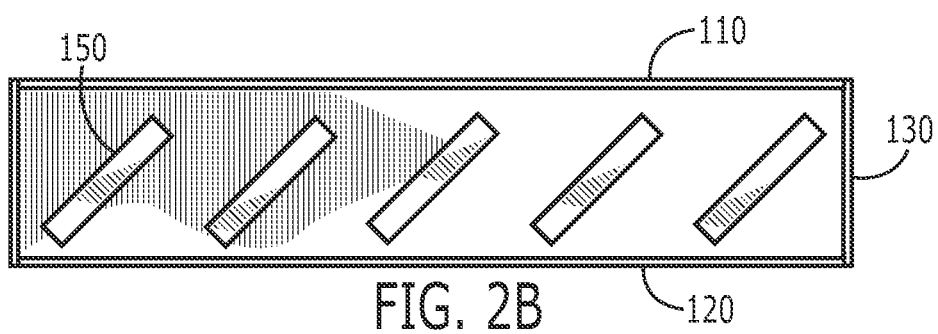
Figure 2C:
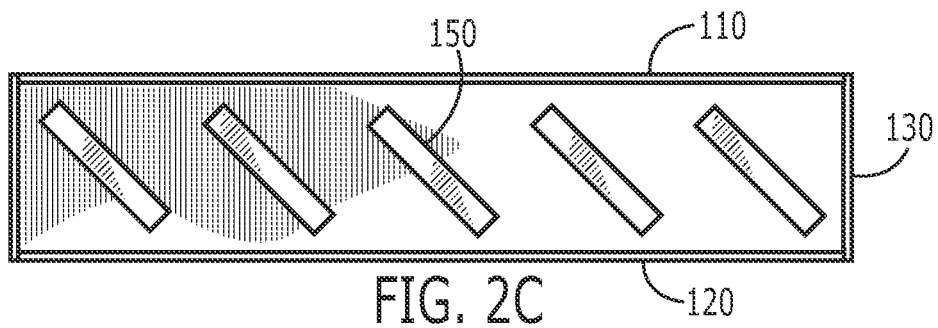

Reference is next made to FIGS. 2A-2C, which illustrate cross-sectional views of the multi-panel system illustrated in FIG. 1 along the lines A-A'. The illustrated configurations demonstrate how the panels may be rotated cooperatively about a parallel axis of rotation. FIG. 2A illustrates a flat or fully obstructed configuration. This orientation obstructs the maximum amount of solar energy regardless of the sun orientation. Therefore, this rotational panel orientation may be used to block visual and thermal solar energy in a single panel configuration without requiring additional manipulation. Likewise, if the panels include some form of solar energy conversion system of types such as electrical or hydrothermal, this flat orientation would yield maximum energy generation when the sun is oriented directly above or normal to the system 100 as illustrated. FIGS. 2B and 2C illustrate opposing 45 degree panel orientations that may be useful in obstructing or allowing solar energy to transmit through the system 100 depending on the sun's orientation with respect to the system. In addition, a 90 degree or full vertical panel orientation (not illustrated) may be used to allow the maximum amount of solar energy to transmit through the system 100 when the sun is oriented directly above or normal to the system 100 as illustrated. The ideal orientation of the panels with respect to the sun depends on the desired solar energy utilization system objective. For example, in certain instances it may be desirable to orient the panels in a perpendicular orientation to receive maximum panel solar exposure, so as to prevent solar energy transmission through the system and/or to maximize the solar energy conversion using a photovoltaic or hydrothermal panel. A likely scenario might be a residential application during the summer, when a user might wish to prevent solar heat transmission into an interior region. Alternatively, it may be desirable to orient the panels parallel to the sun to minimize panel solar exposure so as to allow direct solar energy transmission through the system. Accordingly, an example scenario may be a residential application in the winter, when a user would likely wish to allow the solar energy to transmit through the system to add heat to an internal region. Various combinations or intermediate panel rotational orientations may also be desirable depending on particular scenarios.

Figure 3:
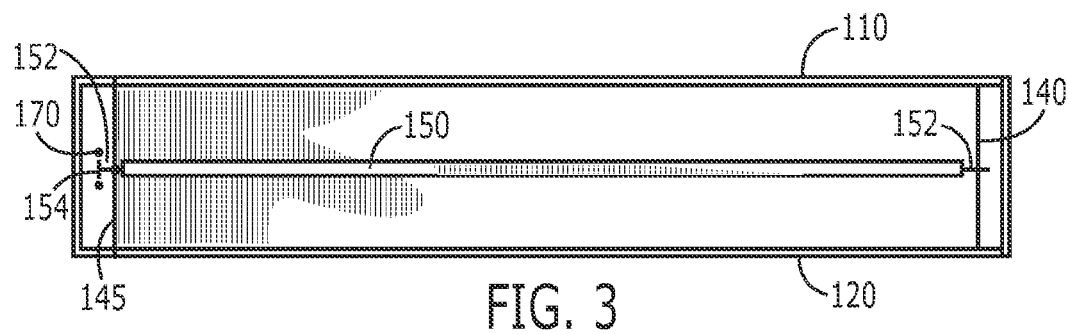
FIG. 3 illustrates a cross-sectional view of the multi-panel system illustrated in FIG. 1 along the lines B-B'.

Reference is next made to FIG. 3, which illustrates a cross-sectional view of the multi-panel system illustrated in FIG. 1 along the lines B-B'. FIG. 3 further illustrates the rotation system 160 and the housing 130 of FIG. 1. As illustrated, the support members 140, 145 rotatably couple the panel couplers 152 so as to support the plurality of panels 150 and thermally isolate the independent chambers on either side. The chambers are used for various rotational, electrical, or hydrothermal routing depending on the particular system 100 configuration. To ensure reliability, thermal heat radiated or reflected by the panels 150 is isolated from the chambers. Various heat venting or distribution systems may be added in accordance with embodiments of the present invention. The relative positioning of the plurality of panels 150 with the front and back transparent members 110, 120 is also illustrated. Likewise, the rotation system 160, chain 170, and chain couplers 154 are illustrated.

Figure 4:
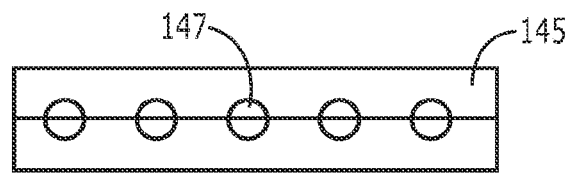
FIG. 4 illustrates a detailed view of a support member within the system embodiment illustrated in FIG. 1.

Reference is next made to FIG. 4, which illustrates a detailed view of a support member 145 within the system embodiment illustrated in FIG. 1. As described above, the support member 145 rotatably couples the plurality of panels 150 to the housing 130 via the panel couplers 152. The support members 145 also thermally isolate the plurality of panels 150 from the chambers. The support member 145 further includes holes 147 which receive the panel couplers 152. The support member 145 may be manufactured as two components—top and bottom portions which can be assembled around the panel couplers 152.

Figure 5A:
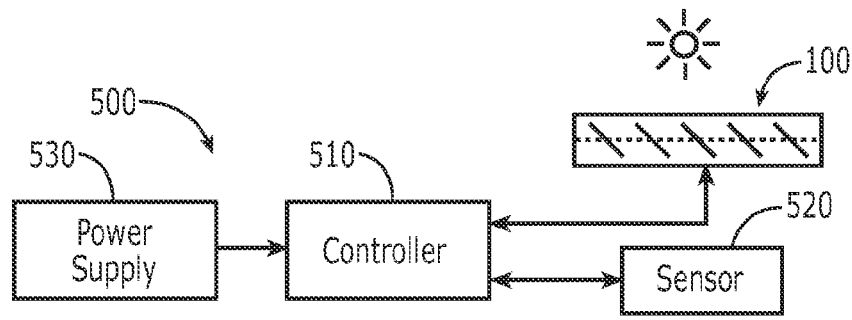
FIG. 5A illustrates a solar climate system in accordance with an alternative embodiment of the present invention.

Reference is next made to FIG. 5A, which illustrates an automatic solar climate system in accordance with an alternative embodiment of the present invention. The system illustrated in 5A includes a multi-panel rotation system 100, a controller 510, a sensor 520, and a power supply 530. The sensor 520 may be configured to detect any one or more types of thermal or solar energy information, including but not limited to incident sun angle, external temperature, internal temperature, photovoltaic power conversion, hydrothermal water temperature, etc. The controller 510 may then be configured to operate the multi-panel rotation system 100 via the power supply 530 depending on the one or more values sensed by the sensor 520. Various algorithms may be utilized in accordance with the present invention.

Figure 5B:
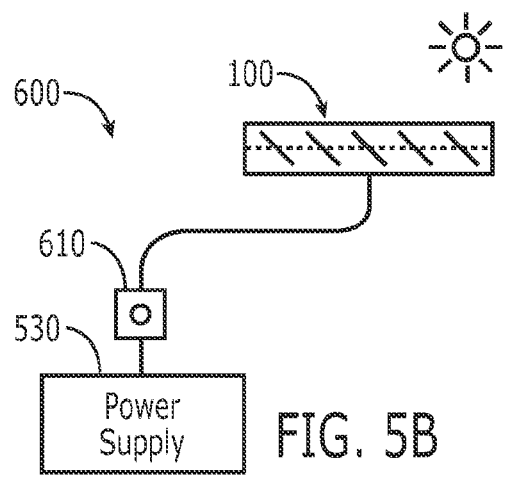
FIG. 5B illustrates a solar energy generation system in accordance with an alternative embodiment of the present invention.

Reference is next made to FIG. 5B, which illustrates a manual-based solar energy generation system in accordance with an alternative embodiment of the present invention. The system illustrated in FIG. 5B further includes a multi-panel rotation system 100, a user input device 610, and a power supply 630. The user input device 610 may be any type of switching device including but not limited to a dimmer that allows a user to selectively control the multi-panel rotational system 100 and power supply 630. A user may then selectively rotate the panels within the multi-panel rotation system 100 according to particular objectives. A user may also utilize the information from various sensor readouts in addition to or in conjunction with his/her own sensory perceptions to identify optimal panel orientation. For example, in a residential application, if a user determines that an internal region is too cold, he/she may rotate the multi-panel system 100 to enable more solar energy to transmit into the interior region. It should be noted that various combinations of manual and automatic control systems may be utilized.

Figure 6:
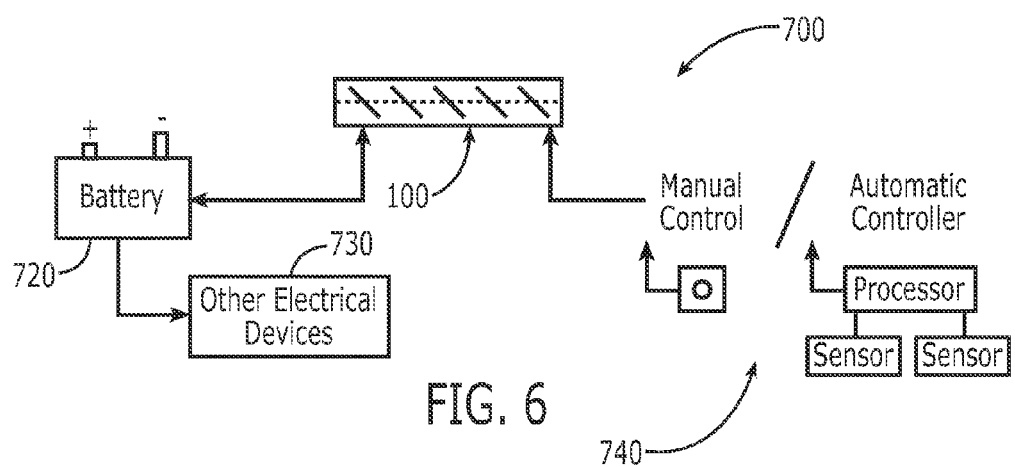
FIG. 6 illustrates a control-based solar electrical system in accordance with an alternative embodiment of the present invention.

Reference is next made to FIG. 6, which illustrates a control-based solar electrical system in accordance with an alternative embodiment of the present invention, designated generally at 700. The system 700 further includes a multi-panel rotation system 100, an electrical storage device 720, other electrical devices 730, and a control mechanism 740. The multi-panel rotation system 100 is configured to convert solar energy into electrical energy, utilizing some form of electrical members on the panels. For example, the panels may be photovoltaic. The electrical energy generated by the panels is transmitted to the electrical storage device 720. The electrical storage device may be a battery or other form of storage system. Various other electrical components may be utilized, including a diode to prevent electrical drain of the storage device during times of limited or no solar energy transmission. The electrical storage device 720 may also be coupled to other electrical devices. In addition, the multi-panel rotation system 100 is coupled to a control mechanism 740. The control mechanism 740 may be manual, automatic, or some combination therein. In addition, the control mechanism 740 may include a power supply for operating the rotation system of the multi-panel rotation system 100. The power supply may be the same as the electrical storage device 720 or may be a separate power supply.

Figure 7:
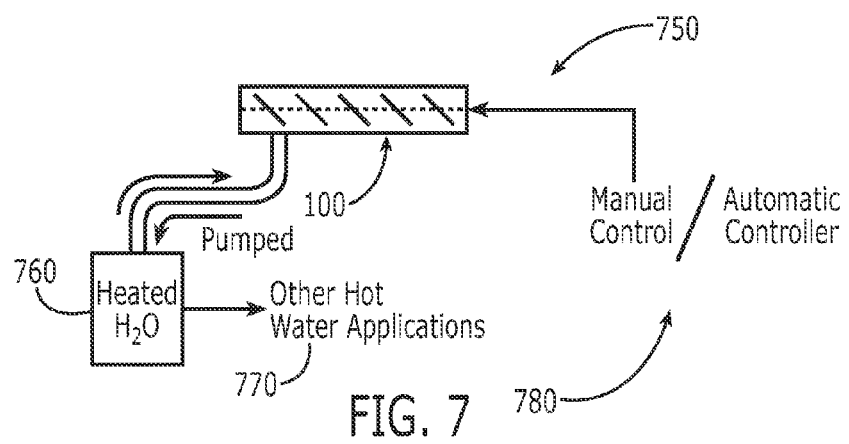
FIG. 7 illustrates a control-based hydrothermal system in accordance with an alternative embodiment of the present invention.

Reference is next made to FIG. 7, which illustrates a control-based hydrothermal system in accordance with an alternative embodiment of the present invention, designated generally at 750. The system 750 further includes a multi-panel hydrothermal rotation system 100, a heated water reservoir or distribution system 760, various hot water applications 770, and a control mechanism 780. The multi-panel hydrothermal rotation system 100 includes water distribution channels such that incident solar energy heats up the water and is transmitted to a reservoir or throughout the hydrothermal system 760 via various pumps and or other water distribution systems. The heated water may then be used for hot water applications such as heating, cooking, washing, etc. In addition, the multi-panel rotation system 100 is coupled to a control mechanism 780. The control mechanism 780 may be manual, automatic, or some combination therein. In addition, the control mechanism 780 may include a power supply for enabling the rotation of the multi-panel rotation system 100.

Figure 8:
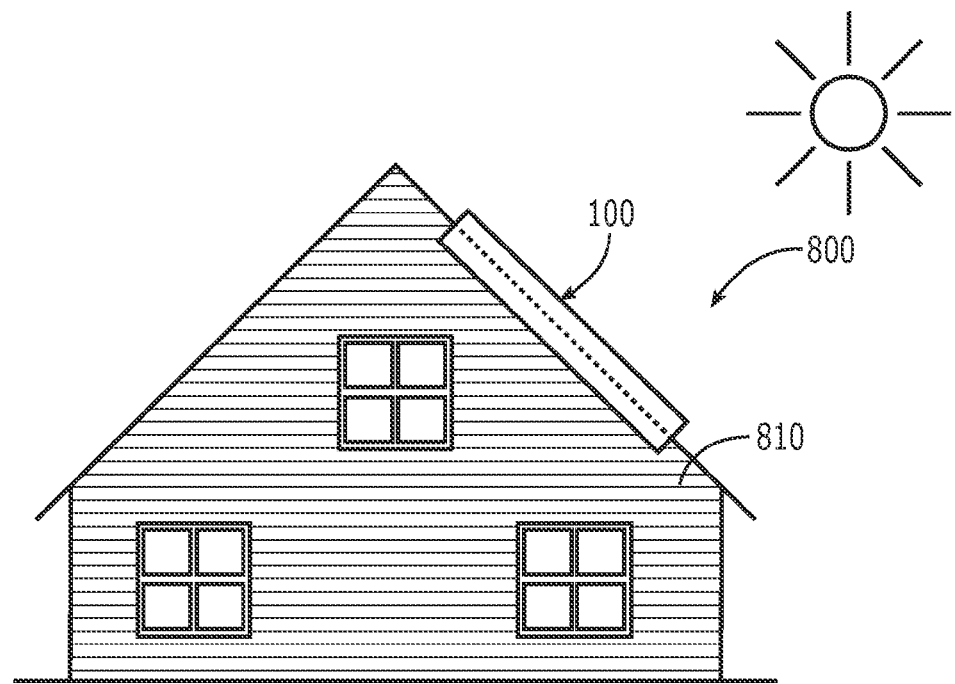
FIG. 8 illustrates a profile view of a residential system, including the positioning of a multi-panel solar system on an interior to exterior recess in accordance with embodiments of the present invention.

Reference is next made to FIG. 8, which illustrates a profile view of a residential system, including the positioning of a multi-panel solar system on an interior to exterior recess in accordance with embodiments of the present invention, designated generally at 800. The interior-exterior system 800 further includes the multi-panel rotation system 100 and a residence 810. The multi-panel rotation system 100 is positioned on an opening, recess, or hole that extends between the interior and exterior regions of the residence 810. In the illustrated example, the surface is on the roof of the residence. Therefore, one side of the multi-panel rotation system 100 is exposed to the inside of the residence while another side is exposed to the outside. The mounting of the multi-panel rotation system 100 to the residence includes thermal insulating, mechanical coupling, and moisture sealing. As discussed above, the multi-panel rotation system 100 may allow solar energy to transmit into the interior of the residence, or it may be configured to obstruct or block solar energy depending on the particular application.

Figure 9:
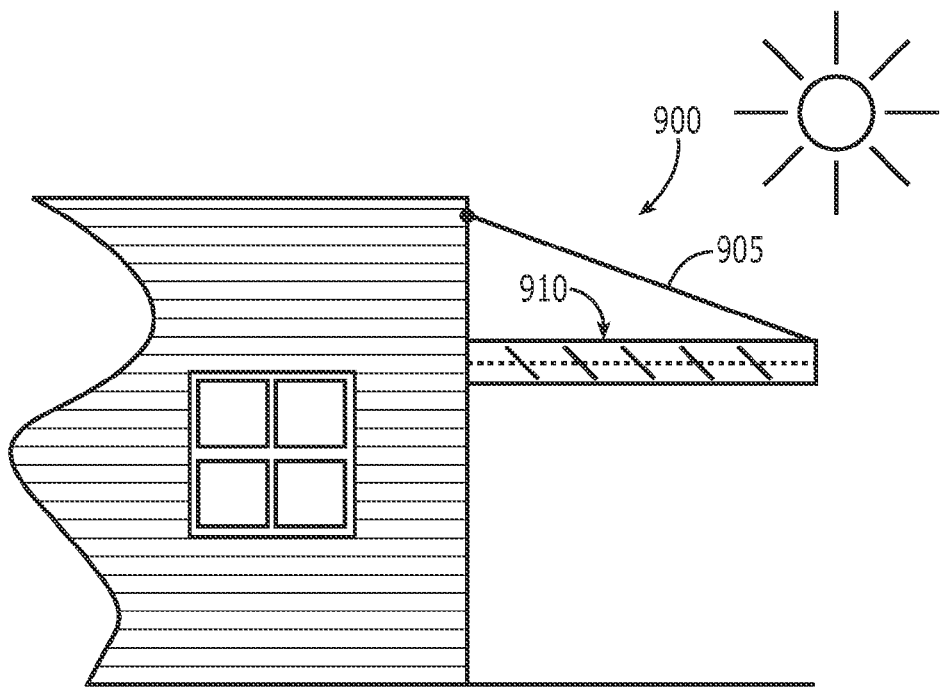
FIG. 9 illustrates a profile view of an alternative residential system, including the positioning of a multi-panel solar system on an exterior location in accordance with embodiments of the present invention.

Reference is next made to FIG. 9, which illustrates a profile view of an alternative residential system, including the positioning of a multi-panel solar system on an exterior location in accordance with embodiments of the present invention, designated generally at 900. The exterior system 900 includes a multi-panel rotation system 910, a support system 905, and a residence 920. The multi-panel rotation system 910 is different from other embodiments described above, in that it does not contain a front and back transparent member. Rather, the plurality of panels are externally exposed to enable weather and other debris to fall through the system in particular panel orientations. The multi-panel rotation system 910 is coupled in part to the residence 920 via a support system 905. Various other coupling mechanisms and schemes may be used in conjunction with the support system 905 as illustrated. The support system 905 couples a far side of the multi-panel rotation system 910 to the residence 920 without obstructing or interfering with incident solar energy. The support system 905 may include a cable or wire as illustrated.

What is claimed is:

1. A multi-panel solar system comprising:
    a plurality of rotatable panels disposed in alignment with one another; wherein the axes of rotation of each of the plurality of panels is perpendicular to the axes at which the panels are disposed in alignment;
    a rotation system mechanically coupled to the plurality of panels that enables the coordinated rotation of all of the panels about parallel axes of rotation, wherein the rotation system includes:
        a sub-chamber thermally isolated from the plurality of panels;
        an electrical motor, disposed within the sub-chamber;
        an electrical controller disposed within the sub-chamber and electrically coupled to the electrical motor;
        a mechanical coupling between the electrical motor and the plurality of panels;
    a housing encasing the plurality of rotatable panels and the rotation system; and
    wherein the housing mechanically supports the relative positioning of the plurality of rotatable panels and insulates thermal transmission of the plurality of panels with respect to a region external to the housing, and wherein the housing includes a thermally insulating and visually transparent member on opposite sides of the plurality of panels, such that the plurality of panels are disposed between the visually transparent members.

2. The system of claim 1, wherein the plurality of rotatable panels are thermally conductive.

3. The system of claim 1, wherein the plurality of rotatable panels are photovoltaic panels, and wherein the plurality of panels are electrically coupled to an electrical storage device.

4. A multi-panel solar system comprising:
    a plurality of rotatable panels disposed in alignment with one another; wherein the axes of rotation of each of the plurality of panels is perpendicular to the axes at which the panels are disposed in alignment;
    a rotation system mechanically coupled to the plurality of panels that enables the coordinated rotation of all of the panels about parallel axes of rotation, wherein the rotation system includes a sub-chamber thermally isolated from the plurality of panels, an electrical motor disposed within the sub-chamber, and an electrical controller disposed within the sub-chamber and electrically coupled to the electrical motor;
    wherein a housing encases the plurality of panels and rotation system, and wherein the housing mechanically supports the relative positioning of the plurality of rotatable panels and insulates thermal transmission of the plurality of panels with respect to a region external to the housing, and wherein the housing includes a thermally insulating and visually transparent member on opposite sides of the plurality of panels, such that the plurality of panels are disposed between the visually transparent members; and
    wherein the plurality of rotatable panels include a thermally conductive circulating liquid.

5. The system of claim 1, wherein the configuration of the rotation system corresponds with the transmission of light through both the thermally insulating and visually transparent members.

6. The system of claim 1 further including a drainage system for facilitating the drainage of external weather debris.

7. A multi-panel solar system comprising:
    a plurality of rotatable panels disposed in alignment with one another; wherein the axes of rotation of each of the plurality of panels is perpendicular to the axes at which the panels are disposed in alignment;
    a rotation system mechanically coupled to the plurality of panels that enables the coordinated rotation of all of the panels about parallel axes of rotation, wherein the rotation system includes a sub-chamber thermally isolated from the plurality of panels, an electrical motor disposed within the sub-chamber, and an electrical controller disposed within the sub-chamber and electrically coupled to the electrical motor;
    wherein a housing encases the plurality of panels and rotation system, and wherein the housing mechanically supports the relative positioning of the plurality of rotatable panels and insulates thermal transmission of the plurality of panels with respect to a region external to the housing, and wherein the housing includes a thermally insulating and visually transparent member on opposite sides of the plurality of panels, such that the plurality of panels are disposed between the visually transparent members; and
    a zero-position sensor configured to determine a zero position corresponding to location in which the plurality of rotatable panels are substantially parallel to the thermally insulating and visually transparent members.

* * * * *